US00RE41792E

(19) United States
(12) Reissued Patent
Sutardja et al.

(10) Patent Number: US RE41,792 E
(45) Date of Reissued Patent: *Oct. 5, 2010

(54) CONTROLLABLE INTEGRATOR

(75) Inventors: Sehat Sutardja, Los Altos Hills, CA (US); Pantas Sutardja, Los Gatos, CA (US)

(73) Assignee: Marvell International Ltd., Hamilton (BM)

( * ) Notice: This patent is subject to a terminal disclaimer.

(21) Appl. No.: 10/614,084

(22) Filed: Jul. 8, 2003

Related U.S. Patent Documents

Reissue of:
(64) Patent No.: 5,805,006
Issued: Sep. 8, 1998
Appl. No.: 08/848,549
Filed: Apr. 28, 1997

U.S. Applications:
(63) Continuation of application No. 09/950,086, filed on Sep. 12, 2001, now Pat. No. Re. 38,455, which is a continuation of application No. 09/609,007, filed on Jun. 22, 2000, now Pat. No. Re. 37,739.

(51) Int. Cl.
*G06F 7/64* (2006.01)
*H03F 1/04* (2006.01)

(52) U.S. Cl. ..... 327/563; 327/91; 327/336; 330/200

(58) Field of Classification Search ..... 327/560, 327/563, 336; 330/134, 200
See application file for complete search history.

(56) References Cited

U.S. PATENT DOCUMENTS 3,617,855 A * 11/1971 Hisatsu ..... 363/148
4,370,572 A 1/1983 Cosand et al.
4,430,609 A * 2/1984 Van Kessel et al. ..... 323/350
4,481,480 A * 11/1984 Metz ..... 330/294
4,484,089 A 11/1984 Viswanathan
4,499,387 A 2/1985 Konishi
4,555,673 A 11/1985 Huijsing et al.
4,598,252 A * 7/1986 Andricos ..... 330/51
4,607,231 A * 8/1986 Nakayama ..... 330/51
4,656,871 A * 4/1987 Czarnocki ..... 73/724
4,868,516 A * 9/1989 Henderson et al. ..... 330/86
5,039,872 A * 8/1991 Oldham ..... 327/106
5,252,865 A 10/1993 Davenport et al.
5,283,631 A 2/1994 Koerner et al.
5,291,452 A * 3/1994 Hotta ..... 365/208
5,313,172 A * 5/1994 Vagher ..... 330/254
5,371,474 A 12/1994 Wassenaar et al.
5,510,738 A 4/1996 Gorecki et al.
5,517,141 A 5/1996 Abdi et al.
5,530,404 A * 6/1996 Debroux ..... 330/278
5,600,275 A 2/1997 Garavan
5,619,169 A * 4/1997 Matsuura ..... 330/254
5,631,607 A 5/1997 Huijsing et al.
5,666,083 A 9/1997 Myers et al.
5,682,119 A 10/1997 Soda
5,708,391 A * 1/1998 Altmann et al. ..... 330/252
5,809,408 A * 9/1998 Fujimoto et al. ..... 455/234.2
5,834,975 A * 11/1998 Bartlett et al. ..... 330/278
5,914,638 A 6/1999 He
5,974,041 A * 10/1999 Kornfeld et al. ..... 370/342
6,040,732 A 3/2000 Brokaw
6,137,355 A * 10/2000 Sevic et al. ..... 330/51
6,480,064 B1 11/2002 Cyrusian

* cited by examiner

*Primary Examiner*—Kenneth B. Wells

(57) ABSTRACT

Integrated circuitry for selectively introducing capacitance and for controlling the transconductance transfer function of one or more amplifiers includes concatenated differential amplifiers with one or more pairs of switchable capacitive components differentially connected across outputs of the differential amplifiers to facilitate operation over a wide range of operating frequencies under control of external signals.

68 Claims, 2 Drawing Sheets

CONTROLLABLE INTEGRATOR

Matter enclosed in heavy brackets [ ] appears in the original patent but forms no part of this reissue specification; matter printed in italics indicates the additions made by reissue.

*Notice: More than one reissue application has been filed for the reissue of U.S. Pat. No. 5,805,006. The reissue applications are application Ser. No. 09/609,007 (now U.S. Reissue Pat. No. RE37,739), application Ser. No. 09/950,086 (now U.S. Reissue Pat. No. RE38,455) and application Ser. No. 10/614,084 (the present application), which is a continuation U.S. Pat. No. RE37,739, which is a continuation of U.S. Pat. No. RE38,455, which is a reissue of U.S. Pat. No. 5,805,006.*

FIELD OF THE INVENTION

This invention relates to integrators and more particularly to circuitry in an integrated circuit that controls frequency response characteristics over a wide range of frequencies with adjustable capacitance and controllable transconductance.

BACKGROUND OF THE INVENTION

Circuit components formed in integrated circuits commonly exhibit wide variations in operating characteristics attributable to variations in the semiconductor processes that form the integrated circuit of such components. By traditional design practices, additional or redundant components may be formed in an integrated circuit during the processing phase, and such additional components may thereafter be connected in or out of a circuit using a laser beam to selectively sever connecting links as required to adjust the operating characteristics of the circuit. Alternatively, signal controllable switches may be incorporated into the design of the integrated circuit to selectively connect additional components in response to externally applied control signals. However, such switches are not ideal in that they incorporate appreciable resistance into a circuit in the conductive state which can be detrimental to high frequency operating characteristics of the integrated circuit.

SUMMARY OF THE INVENTION

In accordance with one embodiment of the present invention, additional capacitive components may be selectively switched into circuit configuration in response to external control signals without introducing significant resistance with the capacitive components. In addition, controllable gain elements may be selectively controlled to amplify the effectiveness of capacitive components in the circuit for a wide range of operating frequency characteristics of the circuit as selectively configured.

DETAILED DESCRIPTION OF THE INVENTION

Figure 1:
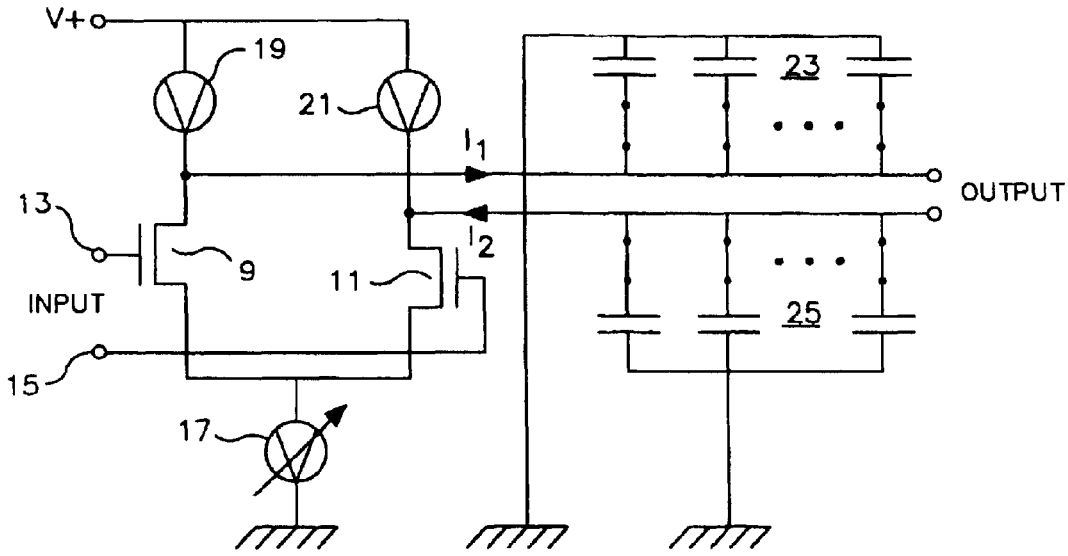
FIGURE 1 (PRIOR ART)
FIG. 1 is a circuit diagram of a conventional transconductance integrator.

Referring now to FIG. 1, there is shown a conventional integrator including a differential pair of gain stages 9, 11 such as field-effect transistors having control electrodes, or gates, coupled to receive control signals applied to inputs 13, 15. The source electrodes, or sources, of the gain stages are coupled together and to a controllable current source 17, and each of the drain electrodes, or drains, is coupled to a controllable current sources 19, 21 and to one or more capacitive elements 23, 25. The sum of the current sources 19, 21 is usually set equal to the current from source 17. Selected ones of the capacitive elements may be coupled to ground, for example, via links that may be removed via laser-beam machining to alter the operating frequency characteristics of the circuit. Alternatively, semiconductor switches may be substituted (not shown) for the links to facilitate control of capacitance in the circuit in response to externally applied signals. However, such semiconductor switches commonly introduce significant resistance along with capacitance thus switched into the circuit, and this adversely affects high frequency operating characteristics of the circuit thus configured.

Figure 2:
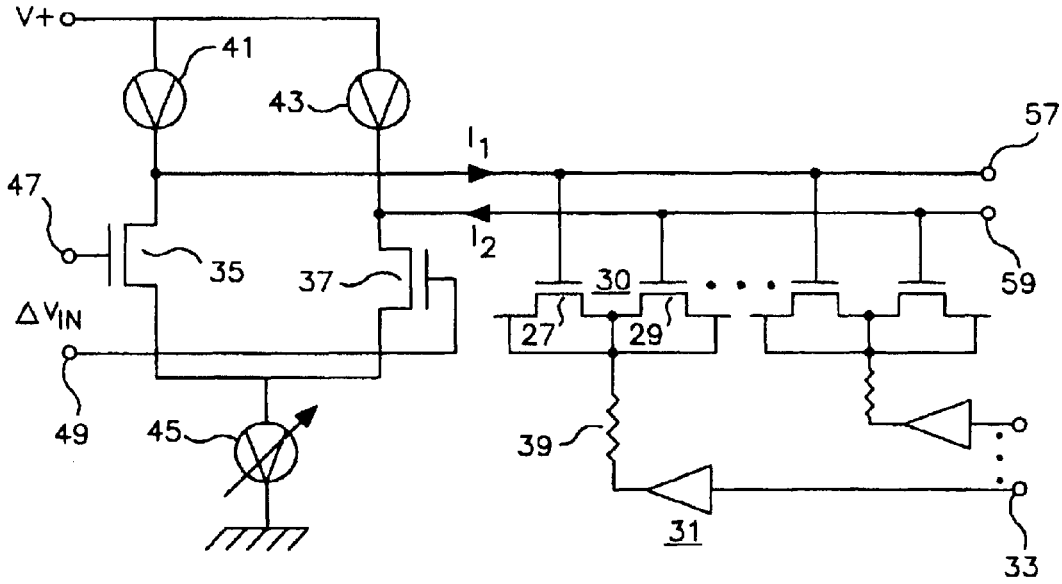
FIG. 2 is a circuit diagram of one embodiment of the present invention.

In accordance with one embodiment of the present invention, one or more differential pairs of capacitive elements are formed for selective connection into the circuit in response to an applied control signal. Specifically, as shown in FIG. 2, each capacitive element is formed as a pair of gain elements 27, 29 such as insulated-gate field-effect transistors with source and drain connected in common as one capacitive electrode and with the gate forming another capacitive electrode. The source-drain connections are connected in common to a control switch 31 that may also include a gain element responsive to an applied control signal for switching in or out the differential pair of capacitive components 27, 29. Specifically, at low-level applied control signal appearing on control input 33 (representative of the ON condition for NMOS type transistors 27, 29) the source-drain connections form conductive channels in the region of the respective gates in known manner to form capacitive components differentially connected across the outputs of the gain stages 35, 37. Thus, for each capacitive component of capacitance C, the differential connection of such components yields C/2 capacitance, without the equivalent resistance 39 of a control switch (in the biasing circuit) affecting the capacitance in the circuit thus configured. At high-level applied control signal appearing on control input 33 (representative of the OFF condition for NMOS type transistors 27, 29), wide depletion regions form adjacent the sources-drains, or essentially no channels form in the vicinities of the gates to contribute only a small fraction of the original capacitance introduced into the circuit. One or more banks of differentially connected capacitive components, each controlled by such bias-adjusting switching circuitry, may be provided to facilitate adjustment or control of the frequency response characteristics of the circuit thus configured.

Figure 3:
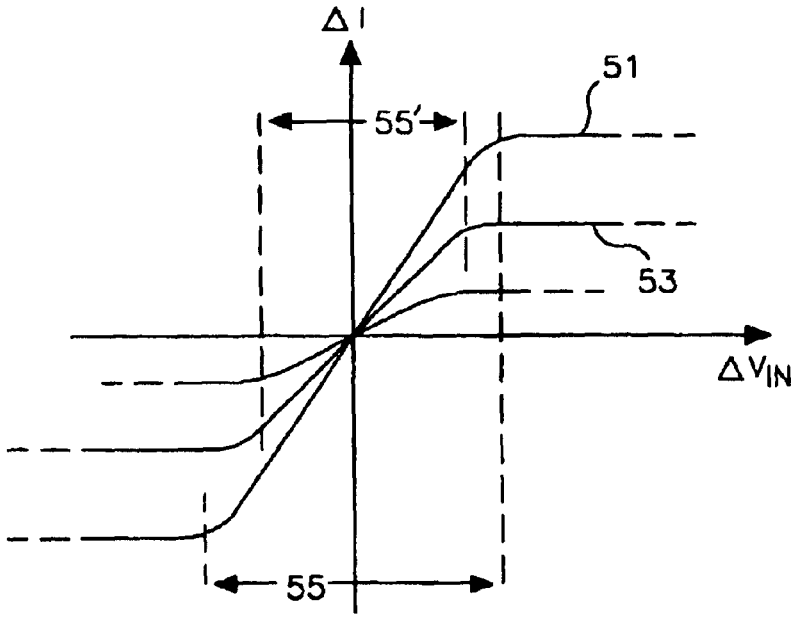
FIG. 3 is a graph illustrating the operating characteristics of a transconductance amplifier.

Referring now to FIG. 3, there is shown a graph of the transfer function of the differential amplifier of FIG. 2 that includes gain elements 35, 37 and current sources 41, 43, 45 connected as shown. Specifically, as the differential of the control voltages 47, 49 applied to the control electrodes increases, the differential of drain currents $I_1$, $I_2$ ($\Delta I = I_1 - I_2$) increases, as shown by the curve 51. In the semiconductor amplifier circuit of FIG. 2, the sum of the drain currents 41, 43 substantially equals the combined current 45, and reducing these current levels typically alters the transfer function of the semiconductor amplifier, as shown by curve 53. The range of control voltages 55 over which the transfer function remains substantially linear diminishes with reduced current levels, as illustrated with reference to curve 53. Thus, at low levels of the combined source currents through current source 45, the substantially linear range of the transfer function on applied control voltages is narrow, and widens 55 with increased current levels. However, for a given level of the combined currents through source 45, significant increases in applied signal voltages appearing at inputs 47, 49 introduces significant non-linearity in the transfer function for operation at applied signal levels beyond the substantially linear range 55.

Figure 4:
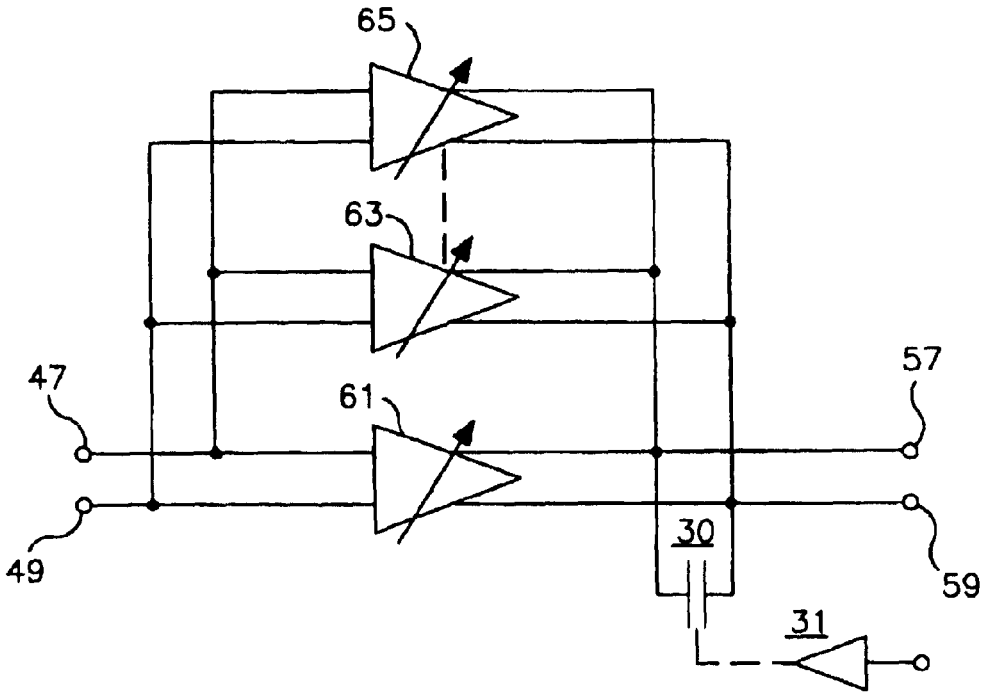
FIG. 4 is a circuit diagram of another embodiment of the present invention for providing wide dynamic control of operating frequency characteristics of the composite circuitry.

In accordance with another embodiment of the present invention, a plurality of amplifiers similar to the amplifier of FIG. 2 are assembled in parallel, as illustrated in FIG. 4, between the differential inputs 47, 49 and the differential outputs 57, 59. Each of the amplifiers may be selectively controlled, for example, via a controllable current source 45 that conducts the currents from the commonly connected sources in each amplifier. In this way, each of the amplifiers 61, 63, 65 may be selectively disabled or enabled to selectively expand the linear range 55, 55' of the combined transfer function. In addition, with one or more pairs of differentially connected capacitive components 27, 29 connected across the outputs 57, 59, the range of frequencies over which the integrated circuit may be operated can be greatly increased, for example, to over 6:1 for operations at about 40 MHz to about 270 MHz. Additionally, for selected values of capacitance C switched into the circuit in the manner previously described, control of one or more of the current sources in the amplifiers 61, 63, 65 may thus be externally controlled to maintain the transconductance ($g_m$) to capacitance (C) ratio ($g_m$/C) substantially constant over a population of integrated circuits thus configured, and for operation of a particular integrated circuit with selected frequency response characteristics. Of course, various known semiconductor technologies such as bi-polar or NMOS or CMOS processes may be used to form integrated circuits including amplifiers and capacitive components, as described above.

Therefore, one design of integrated circuit according to the present invention facilitates formation of $g_m$/C integrators operable over a wide range of frequencies, with dynamic responses conveniently controllable by signals that may be internal or external to the integrated circuit.

What is claimed is:

[1. Integrator apparatus comprising:

an amplifier including a pair of outputs and being responsive to differential input signals for producing differential output signals on the pair of outputs; and a pair of capacitive components connected to the pair of outputs and to a common source of first control signal, the capacitive components including insulated-gate, field-effect transistors having gates connected to respective ones of the pair of outputs and having sources and drains connected in common to receive said first control signal for altering the capacitance of each pair of capacitive component in response to the first control signal applied to the sources and drains thereof.]

[2. Integrator apparatus according to claim 1 comprising a plurality of pairs of capacitive components, each including insulated-gate, field-effect transistors having gates connected to respective ones on the pair of outputs and having sources and drains connected in common to receive the first control signal therefor for altering the capacitance of the capacitive components in response to the first control signal applied to the sources and drains of each of the plurality of pairs of capacitive components.]

[3. Integrator apparatus according to claim 2 wherein the amplifier includes a plurality of differential amplifiers, each having a pair of outputs coupled in common to the plurality of pairs of capacitive components, and each having a pair of inputs connected in common to receive applied differential signals, at least one of the plurality of differential amplifiers also having a transfer function from inputs thereof to outputs thereof that is controllable in response to a second control signal applied thereto for altering the combined transfer function of the plurality of differential amplifiers from the inputs thereof connected in common to the differential outputs thereof coupled in common in response to applied second control signal.]

[4. Integrator apparatus according to claim 1 wherein said amplifier includes a pair of field-effect transistors, each having a drain electrode connected to respective ones of said pair of outputs, and having source electrodes connected in common, with the source and drain electrodes of each transistor forming a conduction channel thereof, and transistors having gate electrodes connected to receive the differential input signals applied thereto to alter the conduction channel thereof; and a current source connected to the drain electrode of each transistor, and another current source connected to the common connection of the source electrodes for conducting the sum of currents in the conduction channels of the pair of transistors.]

[5. Integrator apparatus according to claim 4 wherein said another current source is adjustable to alter the transfer function of the amplifier from the gate electrodes to the pair of outputs thereof.]

[6. Integrator apparatus according to claim 3 wherein the second control signal is adjusted to maintain substantially constant the ratio of the transconductance of the amplifier to the capacitance provided by the capacitive components in response to first control signal applied thereto.]

*7. An amplifier apparatus, comprising:*

*a plurality of amplifier cells,*

*wherein each of the plurality of amplifier cells includes (i) at least one first input in communication with a common control voltage, (ii) a second input in communication with a controllable current signal, and (iii) an output,*

*wherein the plurality of amplifier cells are arranged in parallel,*

*wherein the first input of each of the plurality of amplifier cells is in communication with the first inputs of other ones of the plurality of amplifier cells,*

*wherein the output of each of the plurality of amplifier cells is in communication with the outputs of other ones of the plurality of amplifier cells,*

*wherein each of the plurality of amplifier cells has a transconductance from the first input thereof to the output thereof,*

*wherein each of the plurality of amplifier cells is selectively controllable in response to the controllable current signal applied thereto to one of enable and disable each of the plurality of amplifier cells for adjusting a combined transconductance of the plurality of amplifier cells from the first inputs thereof to the outputs thereof, and*

*wherein an adjustable capacitance is connected to the output of each of the plurality of amplifier cells, the adjustable capacitance includes a pair of gain elements, and the adjustable capacitance is adjustable based on a control signal applied at a common node of the pair of gain elements.*

*8. The amplifier apparatus of claim 7, wherein each of the plurality of amplifier cells comprises at least one transistor.*

*9. The amplifier apparatus of claim 8, wherein each of the plurality of amplifier cells comprises a pair of transistors.*

*10. The amplifier apparatus of claim 9, wherein each pair of transistors comprises (i) a pair of input terminals, (ii) a pair of output terminals, and (iii) a pair of common terminals coupled to the controllable current signal, and*

*wherein each of the amplifier cells includes first and second current sources respectively coupled to the pair of output terminals.*

*11. The amplifier apparatus of claim 9, wherein each of the pairs of transistors includes gates coupled to a common control voltage, and wherein said pairs of input and output terminals include sources and drains coupled together.*

*12. The amplifier apparatus of claim 7, wherein the transconductance of each of the plurality of amplifier cells is substantially identical.*

*13. The amplifier apparatus of claim 7, wherein the transconductance of at least one of the plurality of amplifier cells is different than the transconductance of other ones of the plurality of amplifier cells.*

*14. The amplifier apparatus of claim 6, wherein each of the plurality of amplifier cells comprises a controllable current source that generates the controllable current signal to adjust the transconductance of the amplifier cell.*

*15. The amplifier apparatus of claim 14, wherein the controllable current source of the amplifier cell is in communication with the second input.*

*16. An amplifier device, comprising:*

*a plurality of amplifier cells, each of the plurality of amplifier cells comprising at least one transistor,*

*wherein the plurality of amplifier cells are arranged in parallel,*

*wherein each of the plurality of amplifier cells includes an input terminal,*

*wherein the input terminal of each of the plurality of amplifier cells is in communication with input terminals of other ones of the plurality of amplifier cells,*

*wherein each of the plurality of amplifier cells includes an output terminal,*

*wherein the output terminal of each of the plurality of amplifier cells is in communication with output terminals of other ones of the plurality of amplifier cells, and*

*wherein each of the plurality of amplifier cells has a transconductance from an input thereof to an output thereof; and*

*means for selectively controlling each of the plurality amplifier cells to enable at least one of the plurality of amplifier cells for adjusting a combined transconductance of the amplifier device in response to a controllable current signal,*

*wherein an adjustable capacitance is connected to the output of each of the plurality of amplifier cells, the adjustable capacitance includes a pair of gain elements, and the adjustable capacitance is adjustable based on a control signal applied at a common node of the pair of gain elements.*

*17. The amplifier device of claim 16, wherein each of the plurality of amplifier cells comprises a pair of transistors.*

*18. The amplifier device of claim 17, wherein each pair of transistors comprises (i) a pair of input terminals, (ii) a pair of output terminals, and (iii) a pair of common terminals connected together, and*

*wherein each of the amplifier cells includes first and second current sources respectively coupled to the pair of output terminals.*

*19. The amplifier device of claim 17, wherein each of the pairs of transistors includes gates coupled to respective control signals, and wherein each of the pairs of transistors includes sources and drains coupled together to receive the controllable current signal.*

*20. The amplifier device of claim 16, wherein the transconductance of each of the plurality of amplifier cells is substantially identical.*

*21. The amplifier device of claim 16, wherein the transconductance of at least one of the plurality of amplifier cells is different than the transconductance of other ones of the plurality of amplifier cells.*

*22. An amplifier device, comprising:*

*a plurality of amplifier cells, wherein each of the plurality of amplifier cells comprises:*

*a pair of gain elements, wherein each of the pair of gain elements comprises:*

*i.) a pair of input terminals,*

*ii.) a pair of output terminals, and*

*iii.) a pair of common terminals connected together in communication with a controllable current signal,*

*wherein the plurality of amplifier cells are arranged in parallel,*

*wherein each of the pair of input terminals of the plurality of amplifier cells are in communication with a control voltage and with the pairs of input terminals of other ones of the plurality of amplifier cells,*

*wherein each of the pair of output terminals of the plurality of amplifier cells are in communication with the pairs of output terminals of other ones of the plurality of amplifier cells,*

*wherein each of the plurality of amplifier cells has a transconductance from the input thereof to the output thereof,*

*wherein each of the plurality of amplifier cells is selectively controllable in response to the controllable current signal applied thereto to one of enable and disable each of the plurality of amplifier cells for adjusting a combined transconductance of the plurality of amplifier cells, and*

*wherein an adjustable capacitance is connected to the output of each of the plurality of amplifier cells, the adjustable capacitance includes a pair of gain elements, and the adjustable capacitance is adjustable based on a control signal applied at a common node of the pair of gain elements.*

*23. The amplifier device of claim 22, wherein each of the pair of gain elements comprises a pair of transistors.*

*24. The amplifier device of claim 23, wherein each of the pairs of transistors includes gates coupled to the control voltage, and wherein each of the pairs of transistors includes sources and drains coupled together to receive the controllable current signal.*

*25. The amplifier device of claim 22, wherein each of the amplifier cells includes first and second current sources respectively coupled to the pair of output terminals.*

*26. The amplifier device of claim 22, wherein the transconductance of each of the plurality of amplifier cells is substantially identical.*

*27. The amplifier device of claim 22, wherein the transconductance of at least one of the plurality of amplifier cells is different than the transconductance of other ones of the plurality of amplifier cells.*

*28. The amplifier device of claim 22, wherein each of the plurality of amplifier cells comprises a controllable current source that generates the controllable current signal to adjust the transconductance of the amplifier cell.*

*29. The amplifier apparatus of claim 28, wherein the controllable current source in each of the plurality of amplifier cells is in communication with the corresponding pair of common terminals in each of the plurality of amplifier cells.*

*30. A method of controlling an amplifier apparatus, comprising the steps of:*

*providing a plurality of amplifier cells,*

*wherein each of the plurality of amplifier cells includes (i) at least one first input in communication with a common control voltage, (ii) a second input in communication with a controllable current signal, and (iii) an output,*

*wherein the plurality of amplifier cells are arranged in parallel,*

*wherein the first input of each of the plurality of amplifier cells is in communication with the first inputs of other ones of the plurality of amplifier cells,*

*wherein the output of each of the plurality of amplifier cells is in communication with the outputs of other ones of the plurality of amplifier cells, and*

*wherein each of the plurality of amplifier cells has a transconductance from the first input thereof to the output thereof;*

*receiving the controllable current signal at the second inputs of each of the plurality of amplifier cells;*

*selectively controlling each of the plurality of amplifier cells in response to the received controllable current signal to one of enable and disable each of the plurality of amplifier cells to adjust a combined transconductance of the plurality of amplifier cells from the first inputs thereof to the outputs thereof; and*

*providing an adjustable capacitance connected to the output of each of the plurality of amplifier cells, wherein the adjustable capacitance includes a pair of gain elements, and the adjustable capacitance is adjustable based on a control signal applied at a common node of the pair of gain elements.*

*31. The method of claim 30, wherein each of the plurality of amplifier cells includes at least one transistor.*

*32. The method of claim 30, wherein the transconductance of each of the plurality of amplifier cells is substantially identical.*

*33. The method of claim 30, wherein the transconductance of at least one of the plurality of amplifier cells is different than the transconductance of other ones of the plurality of amplifier cells.*

*34. A method of controlling an amplifier device, comprising the steps of:*

*providing a plurality of amplifier cells, each of the plurality of amplifier cells including at least one transistor,*

*wherein each of the plurality of amplifier cells includes an input terminal, wherein each of the plurality of amplifier cells includes an output terminal, and*

*wherein each of the plurality of amplifier cells has a transconductance from an input thereof to an output thereof;*

*arranging the plurality of amplifier cells in parallel,*

*wherein the input terminal of each of the plurality of amplifier cells is in communication with the input terminals of other ones of the plurality of amplifier cells, and*

*wherein the output terminal of each of the plurality of amplifier cells is in communication with the output terminals of other ones of the plurality of amplifier cells;*

*selectively controlling each of the plurality amplifier cells to enable at least one of the plurality of amplifier cells to adjust a combined transconductance of the amplifier device in response to a controllable current signal; and*

*providing an adjustable capacitance connected to the output of each of the plurality of amplifier cells, wherein the adjustable capacitance includes a pair of gain elements, and the adjustable capacitance is adjustable based on a control signal applied at a common node of the pair of gain elements.*

*35. The method of claim 34, wherein the transconductance of each of the plurality of amplifier cells is substantially identical.*

*36. The method of claim 34, wherein the transconductance of at least one of the plurality of amplifier cells is different than the transconductance of other ones of the plurality of amplifier cells.*

*37. A method for controlling an amplifier device, comprising the steps of:*

*providing a plurality of amplifier cells, wherein each of the plurality of amplifier cells comprises:*

*a pair of gain elements, wherein each of the pair of gain elements comprises:*

*i.) a pair of input terminals,*

*ii.) a pair of output terminals, and*

*iii.) a pair of common terminals connected together in communication with a controllable current signal,*

*wherein each of the plurality of amplifier cells has a transconductance from the input thereof to the output thereof;*

*arranging the plurality of amplifier cells in parallel;*

*arranging each pair of input terminals of the plurality of amplifier cells in common with the pairs of input terminals of other ones of the plurality of amplifier cells;*

*arranging each pair of output terminals of the plurality of amplifier cells in common with the pairs of output terminals of other ones of the plurality of amplifier cells;*

*selectively controlling each of the plurality of amplifier cells in response to the controllable current signal applied thereto to one of enable and disable each of the plurality of amplifier cells to adjust a combined transconductance of the plurality of amplifier cells; and*

*providing an adjustable capacitance connected to the output of each of the plurality of amplifier cells, wherein the adjustable capacitance includes a pair of gain elements, and the adjustable capacitance is adjustable based on a control signal applied at a common node of the pair of gain elements.*

*38. The method of claim 37, wherein the transconductance of each of the plurality of amplifier cells is substantially identical.*

*39. The method of claim 37, wherein the transconductance of at least one of the plurality of amplifier cells is different than the transconductance of other ones of the plurality of amplifier cells.*

*40. An amplifier apparatus, comprising:*

*means for providing a plurality of amplifier cells,*

*wherein each of the plurality of amplifier cells includes (i) at least one first input in communication with a common control voltage, (ii) a second input in communication with a controllable current signal, and (iii) an output,*

*wherein the plurality of amplifier cells are arranged in parallel,*

*wherein the first input of each of the plurality of amplifier cells is in communication with the first inputs of other ones of the plurality of amplifier cells,*

*wherein the output of each of the plurality of amplifier cells is in communication with the outputs of other ones of the plurality of amplifier cells, and*

*wherein each of the plurality of amplifier cells has a transconductance from the first input thereof to the output thereof;*

*means for receiving the control signal at each of the plurality of amplifier cells; and*

*means for selectively controlling each of the plurality of amplifier cells in response to the received controllable current signal to one of enable and disable each of the plurality of amplifier cells to adjust a combined transconductance of the plurality of amplifier cells from the first inputs thereof to the outputs thereof,*

*wherein an adjustable capacitance is connected to the output of each of the plurality of amplifier cells, the adjustable capacitance includes a pair of gain elements, and the adjustable capacitance is adjustable based on a control signal applied at a common node of the pair of gain elements.*

*41. The amplifier apparatus of claim 40, wherein each of the plurality of amplifier cells comprises at least one transistor.*

*42. The amplifier apparatus of claim 40, wherein the transconductance of each of the plurality of amplifier cells is substantially identical.*

*43. The amplifier apparatus of claim 40, wherein the transconductance of at least one of the plurality of amplifier cells is different than the transconductance of other ones of the plurality of amplifier cells.*

*44. An amplifier device, comprising:*

*means for providing a plurality of amplifier cells, each of the plurality of amplifier cells including at least one transistor,*

*wherein each of the plurality of amplifier cells includes an input terminal, wherein each of the plurality of amplifier cells includes an output terminal, and*

*wherein each of the plurality of amplifier cells has a transconductance from an input thereof to an output thereof;*

*means for arranging the plurality of amplifier cells in parallel,*

*wherein the input terminal of each of the plurality of amplifier cells is in communication with the input terminals of other ones of the plurality of amplifier cells, and*

*wherein the output terminal of each of the plurality of amplifier cells is in communication with the output terminals of other ones of the plurality of amplifier cells; and*

*means for selectively controlling each of the plurality amplifier cells to enable at least one of the plurality of amplifier cells to adjust a combined transconductance of the amplifier device in response to a controllable current signal,*

*wherein an adjustable capacitance is connected to the output of each of the plurality of amplifier cells, the adjustable capacitance includes a pair of gain elements, and the adjustable capacitance is adjustable based on a control signal applied at a common node of the pair of gain elements.*

*45. The method of claim 44, wherein the transconductance of each of the plurality of amplifier cells is substantially identical.*

*46. The method of claim 44, wherein the transconductance of at least one of the plurality of amplifier cells is different than the transconductance of other ones of the plurality of amplifier cells.*

*47. An amplifier device, comprising:*

*means for providing a plurality of amplifier cells, wherein each of the plurality of amplifier cells comprises:*

*a pair of gain elements, wherein each of the pair of gain elements comprises:*

*i.) a pair of input terminals,*

*ii.) a pair of output terminals, and*

*iii.) a pair of common terminals connected together in communication with a controllable current signal,*

*wherein each of the plurality of amplifier cells has a transconductance from the input thereof to the output thereof;*

*means for arranging the plurality of amplifier cells in parallel;*

*means for arranging each pair of input terminals of the plurality of amplifier cells in common with the pairs of input terminals of other ones of the plurality of amplifier cells;*

*means for arranging each pair of output terminals of the plurality of amplifier cells in common with the pairs of output terminals of other ones of the plurality of amplifier cells; and*

*means for selectively controlling each of the plurality of amplifier cells in response to the controllable current signal applied thereto to one of enable and disable each of the plurality of amplifier cells to adjust a combined transconductance of the plurality of amplifier cells,*

*wherein an adjustable capacitance is connected to the output of each of the plurality of amplifier cells, the adjustable capacitance includes a pair of gain elements, and the adjustable capacitance is adjustable based on a control signal applied at a common node of the pair of gain elements.*

*48. The method of claim 47, wherein the transconductance of each of the plurality of amplifier cells is substantially identical.*

*49. The method of claim 47, wherein the transconductance of at least one of the plurality of amplifier cells is different than the transconductance of other ones of the plurality of amplifier cells.*

*50. An amplifier apparatus, comprising:*

*a plurality of amplifier cell means,*

*wherein each of the plurality of amplifier cell means includes (i) at least one first input in communication with a common control voltage, (ii) a second input in communication with a controllable current signal, and (iii) an output,*

*wherein the plurality of amplifier cell means are arranged in parallel,*

*wherein the output of each of the plurality of amplifier cell means is in communication with the outputs of other ones of the plurality of amplifier cell means,*

*wherein the first input of each of the plurality of amplifier cell means is in communication with the first inputs of other ones of the plurality of amplifier cell means,*

*wherein each of the plurality of amplifier cell means has a transconductance from the first input thereof to the output thereof,*

*wherein each of the plurality of amplifier cell means is selectively controllable in response to the controllable current signal applied thereto to one of enable and disable each of the plurality of amplifier cell*

*means for adjusting a combined transconductance of the plurality of amplifier cell means from the first inputs thereof to the outputs thereof, and*

*wherein an adjustable capacitance is connected to the output of each of the plurality of amplifier cell means, the adjustable capacitance includes a pair of gain elements, and the adjustable capacitance is adjustable based on a control signal applied at a common node of the pair of gain elements.*

*51. An amplifier device, comprising:*

*a plurality of amplifier cell means, each of the plurality of amplifier cell means comprising at least one transistor,*

*wherein the plurality of amplifier cell means are arranged in parallel,*

*wherein each of the plurality of amplifier cell means includes an input terminal,*

*wherein the input terminal of each of the plurality of amplifier cell means is in communication with input terminals of other ones of the plurality of amplifier cell means,*

*wherein each of the plurality of amplifier cell means includes an output terminal,*

*wherein the output terminal of each of the plurality of amplifier cell means is in communication with output terminals of other ones of the plurality of amplifier cell means, and*

*wherein each of the plurality of amplifier cell means has a transconductance from an input thereof to an output thereof; and*

*means for selectively controlling each of the plurality amplifier cell means to enable at least one of the plurality of amplifier cell means for adjusting a combined transconductance of the amplifier device in response to a controllable current signal,*

*wherein an adjustable capacitance is connected to the output of each of the plurality of amplifier cell means, the adjustable capacitance includes a pair of gain elements, and the adjustable capacitance is adjustable based on a control signal applied at a common node of the pair of gain elements.*

*52. An amplifier apparatus with a controllable Gm, comprising:*

*a plurality of Gm cells,*

*wherein each of the plurality of Gm cells includes (i) at least one first input in communication with a common control voltage, (ii) a second input in communication with a controllable current signal, and (iii) an output,*

*wherein the plurality of Gm cells are arranged in parallel,*

*wherein the first input of each of the plurality of Gm cells is in communication with the first inputs of other ones of the plurality of Gm cells,*

*wherein the output of each of the plurality of Gm cells is in communication with the outputs of other ones of the plurality of Gm cells, and*

*wherein each of the plurality of Gm cells is selectively controllable in response to the controllable current signal applied thereto to one of enable and disable each of the plurality of Gm cells for adjusting a combined Gm of the plurality of Gm cells, and*

*wherein an adjustable capacitance is connected to the output of each of the plurality of Gm cells, the adjustable capacitance includes a pair of gain elements, and the adjustable capacitance is adjustable based on a control signal applied at a common node of the pair of gain elements.*

*53. The amplifier apparatus of claim 52, wherein each of the plurality of Gm cells comprises at least one transistor.*

*54. The amplifier apparatus of claim 53, wherein each of the plurality of Gm cells comprises a pair of transistors.*

*55. The amplifier apparatus of claim 54, wherein each pair of transistors comprises (i) a pair of input terminals, (ii) a pair of output terminals, and (iii) a pair of common terminals connected together in communication with the controllable current signal, and*

*wherein each of the Gm cells includes first and second current sources respectively coupled to the pair of output terminals.*

*56. The amplifier apparatus of claim 54, wherein each of the pairs of transistors includes gates coupled to the common control voltage, and wherein each of the pairs of transistors includes sources and drains coupled together to receive the control controllable current signal.*

*57. The amplifier apparatus of claim 52, wherein the Gm of each of the plurality of Gm cells is substantially identical.*

*58. The amplifier apparatus of claim 52, wherein the Gm of at least one of the plurality of Gm cells is different than the Gm of other ones of the plurality of Gm cells.*

*59. The amplifier apparatus of claim 52, wherein each of the plurality of Gm cells comprises a controllable current source to generate the controllable current signal to adjust the Gm of the Gm cell.*

*60. The amplifier apparatus of claim 59, wherein the controllable current source of the Gm cell is in communication with the second input.*

*61. An amplifier device with a controllable Gm, comprising:*

*a plurality of Gm cells, each of the plurality of Gm cells comprising at least one transistor,*

*wherein the plurality of Gm cells are arranged in parallel,*

*wherein each of the plurality of Gm cells includes an input terminal,*

*wherein the input terminal of each of the plurality of Gm cells is in communication with input terminals of other ones of the plurality of Gm cells,*

*wherein each of the plurality of Gm cells includes an output terminal,*

*wherein the output terminal of each of the plurality of Gm cells is in communication with output terminals of other ones of the plurality of Gm cells, and*

*means for selectively controlling each of the plurality Gm cells to enable at least one of the plurality of Gm cells for adjusting a combined Gm of the amplifier device in response to a controllable current signal,*

*wherein an adjustable capacitance is connected to the output terminal of each of the plurality of Gm cells, the adjustable capacitance includes a pair of gain elements, and the adjustable capacitance is adjustable based on a control signal applied at a common node of the pair of gain elements.*

*62. The amplifier device of claim 61, wherein each of the plurality of Gm cells comprises a pair of transistors.*

*63. The amplifier device of claim 62, wherein each pair of transistors comprises (i) a pair of input terminals, (ii) a pair of output terminals, and (iii) a pair of common terminals connected together in communication with the controllable current signal, and*

*wherein each of the Gm cells includes first and second current sources respectively coupled to the pair of output terminals.*

*64. The amplifier device of claim 62, wherein each of the pairs of transistors includes gates coupled to a common con-*

*trol voltage, and wherein each of the pairs of transistors includes sources and drains coupled together to receive the controllable current signal.*

*65. The amplifier device of claim 61, wherein the Gm of each of the plurality of Gm cells is substantially identical.*

*66. The amplifier device of claim 61, wherein the Gm of at least one of the plurality of Gm cells is different than the Gm of other ones of the plurality of Gm cells.*

*67. A method of controlling Gm, comprising the steps of:*

*providing a plurality of Gm cells,*

*wherein each of the plurality of Gm cells includes (i) at least one first input in communication with a common control voltage, (ii) a second input in communication with a controllable current signal, and (iii) an output,*

*wherein the plurality of Gm cells are arranged in parallel,*

*wherein the first input of each of the plurality of Gm cells is in communication with the first inputs of other ones of the plurality of Gm cells,*

*wherein the output of each of the plurality of Gm cells is in communication with the outputs of other ones of the plurality of Gm cells; and*

*providing an adjustable capacitance connected to the output of each of the plurality of Gm cells, wherein the adjustable capacitance includes a pair of gain elements, and the adjustable capacitance is adjustable based on a control signal applied at a common node of the pair of gain elements.*

*68. The method of claim 67, wherein the Gm of each of the plurality of Gm cells is substantially identical.*

*69. The method of claim 67, wherein the Gm of at least one of the plurality of Gm cells is different than the Gm of other ones of the plurality of Gm cells.*

*70. A method of controlling Gm, comprising the steps of:*

*providing a plurality of Gm cells, each of the plurality of Gm cells comprising at least one transistor,*

*arranging the plurality of Gm cells in parallel,*

*wherein each of the plurality of Gm cells includes an input terminal,*

*wherein the input terminal of each of the plurality of Gm cells is in communication with input terminals of other ones of the plurality of Gm cells,*

*wherein each of the plurality of Gm cells includes an output terminal,*

*wherein the output terminal of each of the plurality of Gm cells is in communication with output terminals of other ones of the plurality of Gm cells, and*

*selectively controlling each of the plurality Gm cells to enable at least one of the plurality of Gm cells for adjusting a combined Gm of the plurality of Gm cells in response to a controllable current signal; and*

*providing an adjustable capacitance connected to the output of each of the plurality of amplifier cells, wherein the adjustable capacitance includes a pair of gain elements, and the adjustable capacitance is adjustable based on a control signal applied at a common node of the pair of gain elements.*

*71. The method of claim 70, wherein the Gm of each of the plurality of Gm cells is substantially identical.*

*72. The method of claim 70, wherein the Gm of at least one of the plurality of Gm cells is different than the Gm of other ones of the plurality of Gm cells.*

*73. An amplifier apparatus, comprising:*

*a plurality of amplifier cells,*

*wherein each of the plurality of amplifier cells includes (i) at least one first input in communication with a common control voltage, (ii) a second input in communication with a controllable current signal, and (iii) an output,*

*wherein each of the plurality of amplifier cells has a transconductance from the input thereof to the output thereof,*

*wherein each of the plurality of amplifier cells is selectively controllable in response to the controllable current signal applied thereto to one of enable and disable each of the plurality of amplifier cells for adjusting a combined transconductance of the plurality of amplifier cells from the inputs thereof to the outputs thereof, and*

*wherein an adjustable capacitance is connected to the output of each of the plurality of amplifier cells, the adjustable capacitance includes a pair of gain elements, and the adjustable capacitance is adjustable based on a control signal applied at a common node of the pair of gain elements.*

*74. An amplifier device, comprising:*

*a plurality of amplifier cells, each of the plurality of amplifier cells comprising at least one transistor,*

*wherein the plurality of amplifier cells are arranged in parallel, and*

*wherein each of the plurality of amplifier cells has a transconductance from an input thereof to an output thereof; and*

*means for selectively controlling each of the plurality amplifier cells to enable at least one of the plurality of amplifier cells for adjusting a combined transconductance of the amplifier device in response to a controllable current signal,*

*wherein an adjustable capacitance is connected to the output of each of the plurality of amplifier cells, the adjustable capacitance includes a pair of gain elements, and the adjustable capacitance is adjustable based on a control signal applied at a common node of the pair of gain elements.*

* * * * *